United States Patent
Kobayashi et al.

(10) Patent No.: US 10,942,886 B2
(45) Date of Patent: *Mar. 9, 2021

(54) DATA TRANSMISSION METHOD AND DATA TRANSMISSION SYSTEM

(71) Applicant: KINETIC TECHNOLOGIES, San Jose, CA (US)

(72) Inventors: Alan Kobayashi, Los Altos, CA (US); Sujan Valiyaka Thomas, Pleasanton, CA (US); Ramakrishna Chilukuri, San Jose, CA (US); Rahul Kumar Agarwal, Saratoga, CA (US); Iyothsna Nagaraja, San Jose, CA (US)

(73) Assignee: Kinetic Technologies, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/808,283

(22) Filed: Mar. 3, 2020

(65) Prior Publication Data

US 2020/0257645 A1 Aug. 13, 2020

Related U.S. Application Data

(63) Continuation of application No. 16/120,735, filed on Sep. 4, 2018, now Pat. No. 10,585,837.

(60) Provisional application No. 62/580,619, filed on Nov. 2, 2017, provisional application No. 62/574,060, filed on Oct. 18, 2017, provisional application No. 62/573,464, filed on Oct. 17, 2017.

(51) Int. Cl.
*G06F 13/42* (2006.01)
*H03M 13/15* (2006.01)

(52) U.S. Cl.
CPC ......... *G06F 13/42* (2013.01); *H03M 13/1515* (2013.01)

(58) Field of Classification Search
CPC ..................... G06F 13/42; H03M 13/1515
See application file for complete search history.

(56) References Cited

U.S. PATENT DOCUMENTS

| | | | |
|---|---|---|---|
| 10,585,837 B2 * | 3/2020 | Kobayashi | G06F 13/42 |
| 2006/0092893 A1 | 5/2006 | Champion et al. | |
| 2014/0321527 A1 | 10/2014 | Inata et al. | |
| 2014/0376625 A1 | 12/2014 | Lee et al. | |

(Continued)

OTHER PUBLICATIONS

Jim Choate, "VESA—DisplayPort Alternate Mode on USB-C—Technical Overview", UsSB Implementers Forum 2016, Houston, Sep. 27-28, 2016 (39 pages).

*Primary Examiner* — Henry Tsai
*Assistant Examiner* — John B Roche
(74) *Attorney, Agent, or Firm* — Sheppard Mullin Richter & Hampton LLP

(57) ABSTRACT

A data transmission method and system for enhanced channel coding efficiency of a DisplayPort interface is disclosed. One method comprises transmitting a plurality of coding units for each micro-packet in each of one or more lanes of a DisplayPort Main Link from a DisplayPort transmitter, wherein each of the coding units comprises: a group of m symbol chunks, each symbol chunk including four 8-bit symbols, wherein m is 2 or 4; and an n-bit code data indicator that precedes the group of m-symbol chunks, wherein n is 2 or 4, and wherein the n-bit code data indicator indicates a content type of the m symbol chunks.

22 Claims, 12 Drawing Sheets

(56) References Cited

U.S. PATENT DOCUMENTS

2015/0163512 A1  6/2015 Cai et al.
2015/0280895 A1  10/2015 Whitby-Stevens et al.

* cited by examiner

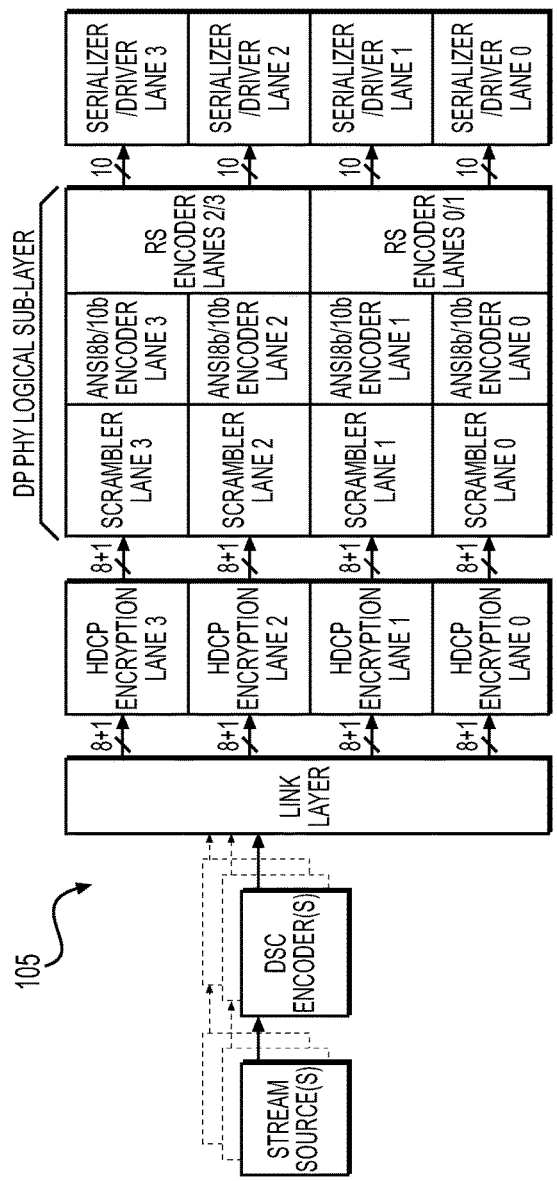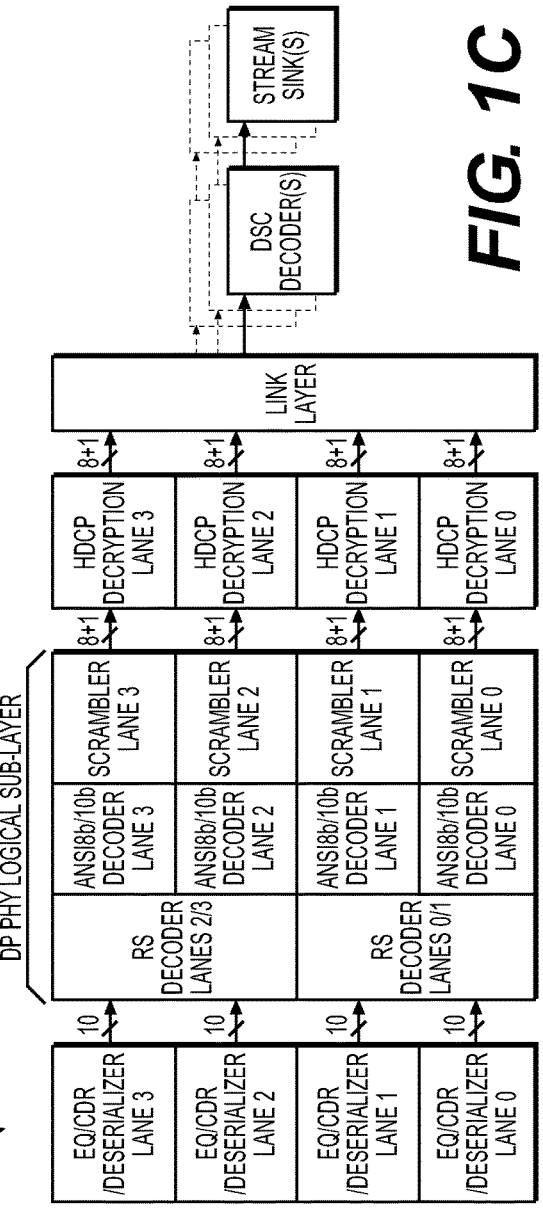

DATA TRANSMISSION METHOD AND DATA TRANSMISSION SYSTEM

CROSS-REFERENCE TO RELATED APPLICATIONS

This application is a continuation of U.S. patent application Ser. No. 16/120,735, filed Sep. 4, 2018, which claims the benefit of priority to U.S. Provisional Patent Application No. 62/573,464 filed Oct. 17, 2017; U.S. Provisional Patent Application No. 62/574,060 filed on Oct. 18, 2017; and U.S. Provisional Patent Application No. 62/580,619 filed Nov. 2, 2017. The above-referenced applications are incorporated herein by reference in their entirety.

BACKGROUND

Field of Disclosure

The present disclosure relates generally to an enhanced data stream transmission method and system using the DisplayPort transport protocol.

Description of Related Art

The DisplayPort (DP) Standard is a digital display interface developed by a consortium of computer and integrated circuit manufacturers and standardized by the Video Electronics Standards Association (VESA). The interface is primarily used to connect a video and audio source such as a personal computer, laptop computer, tablet or smartphone to a display device such as a computer monitor or television display. A DP data stream may be transmitted through standard DisplayPort connectors and cables or through a USB Type-C connector and associated cables, in which case it is transported alongside Universal Serial Bus (USB) data. The current DisplayPort Version 1.4 (DP1.4) provides for a raw serial bit rate of 8.1 Gbps per lane over 4 lanes, resulting in a total raw bit rate of 32.4 Gbps. As it uses ANSI 8 b/10 b coding, which is that every 8-bits payload data is encoded to a 10-bit character, it has a channel coding efficiency of 80%. Therefore, the raw bit rate of 32.4 Gbps is reduced to a data bit rate of 25.92 Gbps. Under some circumstances, DisplayPort Version 1.4 may also use a Reed Solomon Forward Error Correction (RS FEC) feature, which reduces the channel coding efficiency to 78.1% due to the overhead of RS parity symbol transmission.

BACKGROUND REFERENCES

Non-patent Document 1: VESA-DisplayPort Alternate Mode on USB-C Technical Overview, Sep. 27-28, 2016.

SUMMARY

One aspect of the present disclosure is a data transmission method for enhanced channel coding efficiency of a DisplayPort interface that includes: transmitting a plurality of coding units for each micro-packet in each of one or more lanes of a DisplayPort Main Link from a DisplayPort transmitter, wherein each of the coding units comprises: a group of m symbol chunks, each symbol chunk including four 8-bit symbols, wherein m is 2 or 4; and an n-bit code data indicator that precedes the group of m-symbol chunks, wherein n is 2 or 4, and wherein the n-bit code data indicator indicates a content type of the m symbol chunks.

Another aspect of the present disclosure is a transmission system for a DisplayPort interface that includes: one or more lane serializer-driver elements; a PHY logical sub-layer element configured to arrange and transmit stream data to the one or more lane serializer-drivers, wherein the stream data comprises a plurality of coding units for each micro-packet directed to each of the one or more lane serializer-drivers, and wherein each of the coding units comprises: a group of m symbol chunks, each symbol chunk including four 8-bit symbols, wherein m is 2 or 4; and an n-bit code data indicator that precedes the group of m-symbol chunks, wherein n is 2 or 4, and wherein the n-bit code data indicator indicates a content type of the m symbol chunks.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1B illustrates logical block diagram of a DP Source Device;

FIG. 1C illustrates logical block diagram of a DP Sink Device;

DETAILED DESCRIPTION OF EMBODIMENTS

Figure 1A:
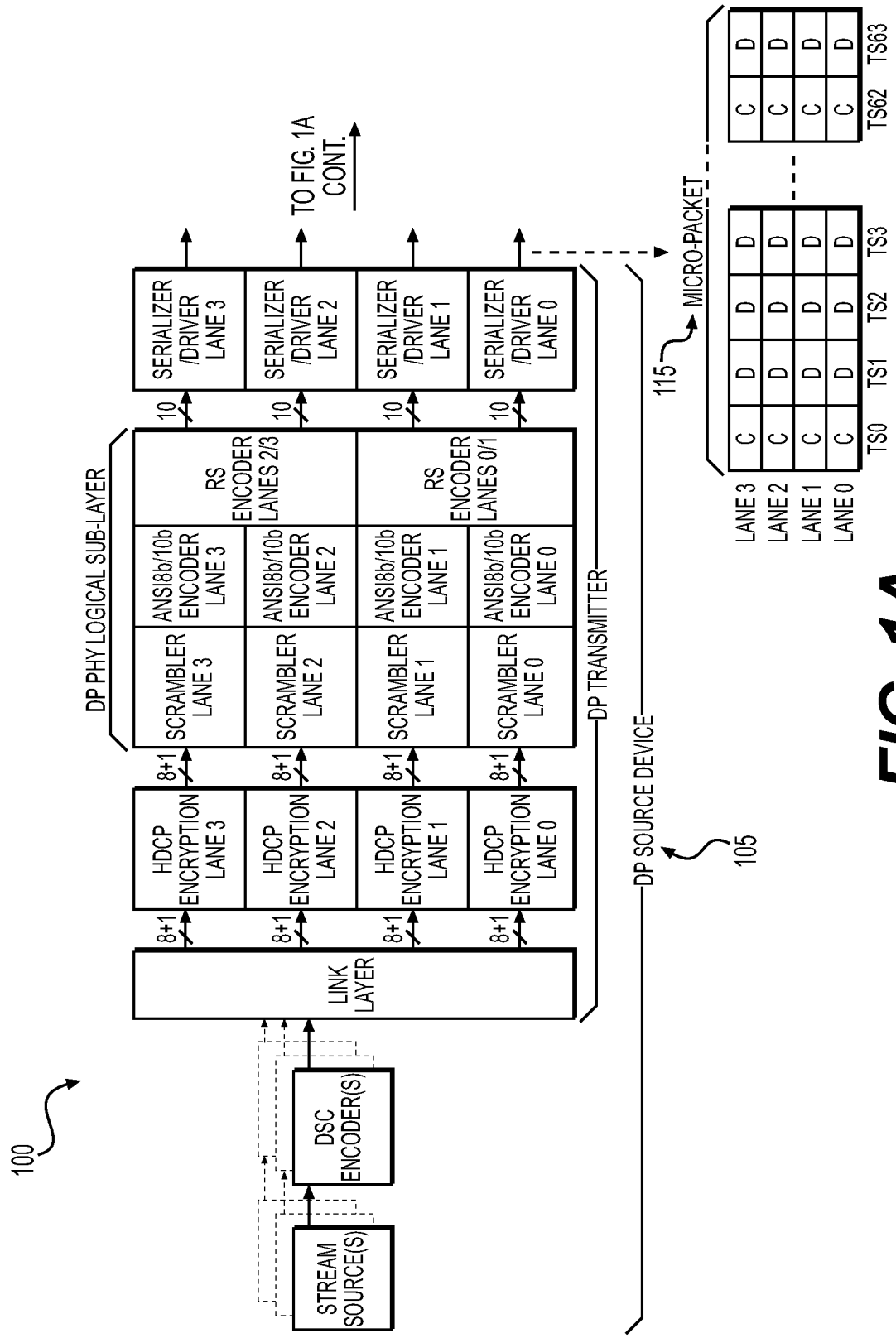
FIG. 1A illustrates a logical block diagram of a DP Source Device and a DP Sink Device.
Figure 1A:
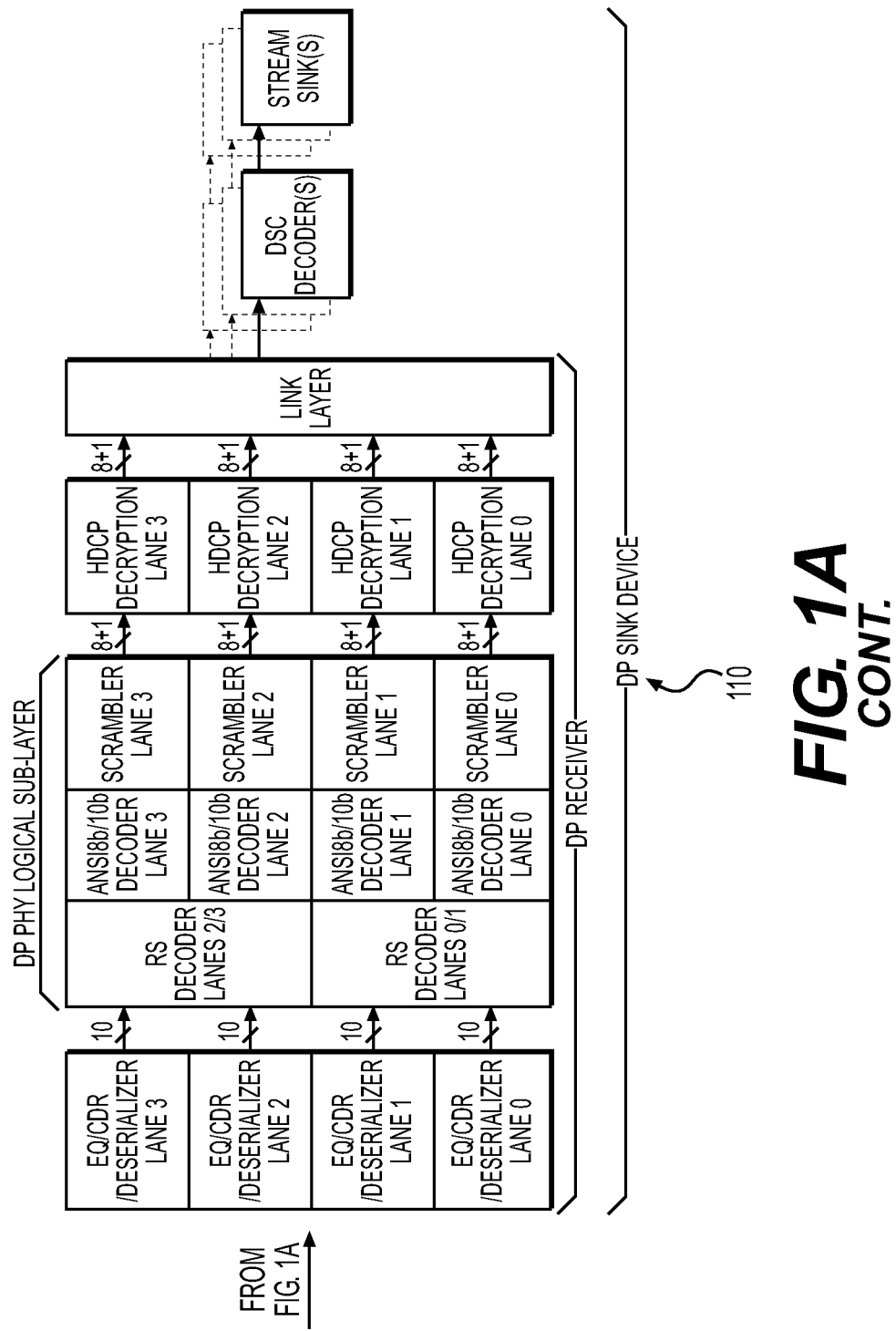

Referring now to the drawings, wherein like reference numerals designate identical or corresponding parts throughout the several views, logical block diagrams of a DP system that may be used, for example, to implement aspects of the DP Standard Version 1.4, is shown in FIGS. 1A, 1B and 1C. FIG. 1A illustrates an end-to-end system 100 that includes a DP Source Device (including a DP Transmitter) 105 (also shown in FIG. 1B) and DP Sink Device (including a DP Receiver) 110 (also shown in FIG. 1C).

Referring to FIG. 1B, DP Source Device 105 may include a stream source, a Display Stream Compression (DSC) encoder to perform an optional stream compression, a Link Layer block to map 8-bit Symbols and/or DSC-encoded 8-bit Symbols into 9-bit DP Link Layer Link Symbols for each of the four DP Main Link lanes, High-bandwidth Digital Content Protection (HDCP) encryption elements to perform optional HDCP encryption, scrambler elements, ANSI 8 b/10 b encoder elements and serializer/driver elements. Optional RS FEC elements operate on Lanes 0/1 and Lanes 2/3 for RS block 2-way interleaving operation. The 9-bit Link Symbol consists of 1 bit for distinguishing a Control Link Symbol from a Data Link Symbol plus 8 bits of link symbol data. In some embodiments, Data Link Symbol data may represent, for example, video pixels, audio samples, metadata, and the like, where Control Link Symbol data may represent, for example, synchronization and other link control information.

Referring to FIG. 1C, DP Sink Device 110 may include Equalizer & Clock/Data Recovery (EQ/CDR) deserializer elements, RS FEC decoder elements, ANSI 8 b/10 b decoder elements, descrambler elements, HDCP decryption elements, Link Layer block, DSC decoder, and stream sink.

Referring again, to FIG. 1A, a simplified illustration of a DP Micro-Packet 115 is shown. Over the 4-lane DP Main Link, each time slot (TS) represents a DP Link Symbol clock cycle. Micro-Packet 115 has 64 time slots, TS[0] to TS[63]. A total of 256 Link Symbols (64 time slots/lane*4 lanes) is transmitted per Micro-Packet 115, carrying a total of 256 8-bit symbols or 2,048 symbol data bits.

As each DP Link Symbol is encoded into a 10-bit ANSI 8 b/10 b character, the total number of bits transmitted over 4 lanes per Micro-Packet is 2,560 bits (256 characters*10 bits/character). Therefore, the channel coding efficiency is 2,048 symbol data bits/2,560 channel-coded bits, or 80% per Micro-Packet 115.

For a given time slot, the four Main Link lanes carry either four Data Link Symbols (D) or four Control Link Symbols (C). The DP Standard defines eleven Control Link Symbols and either uses the same Control Link Symbol on all four lanes in SST (Single Stream Transport) mode or combines the four Control Link Symbols to represent one of nine Control Link Symbol Sequences defined by the DP Standard in MST (Multi Stream Transport) mode.

Figure 2A:
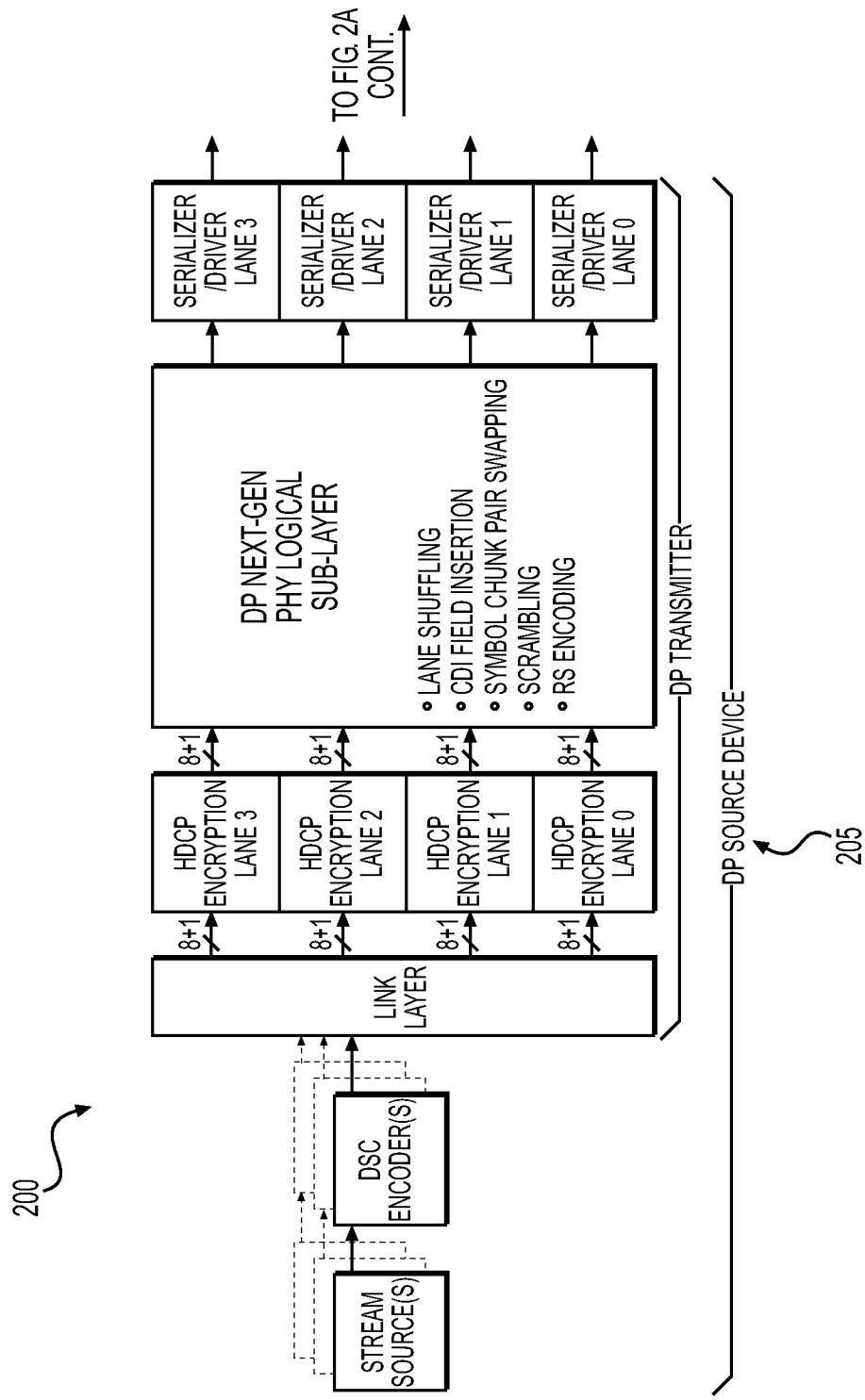
FIG. 2A illustrates logical block diagram of a DP Source Device and a DP Sink Device using enhanced channel coding efficiency according to an embodiment.
Figure 2A:
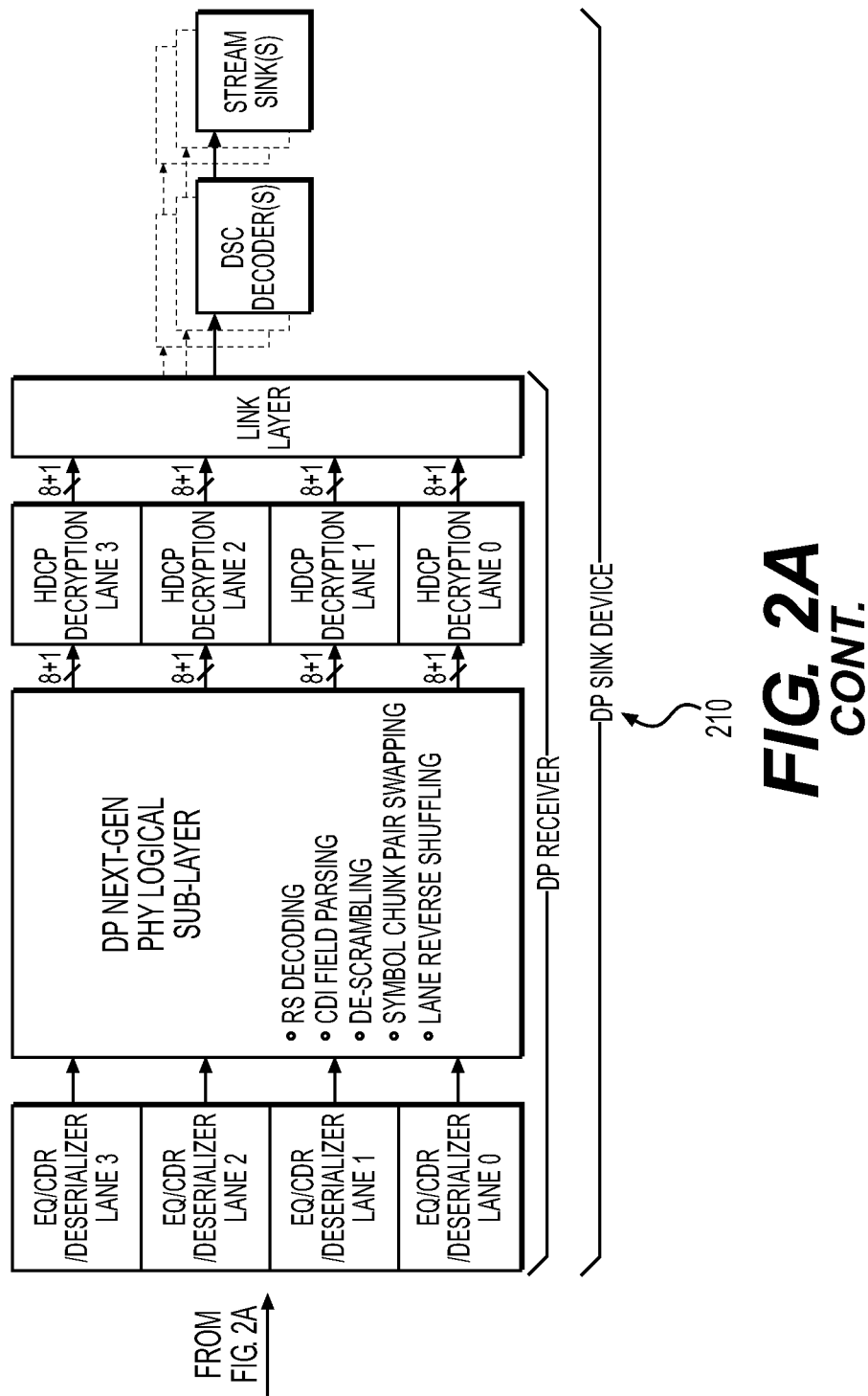
Figure 2B:
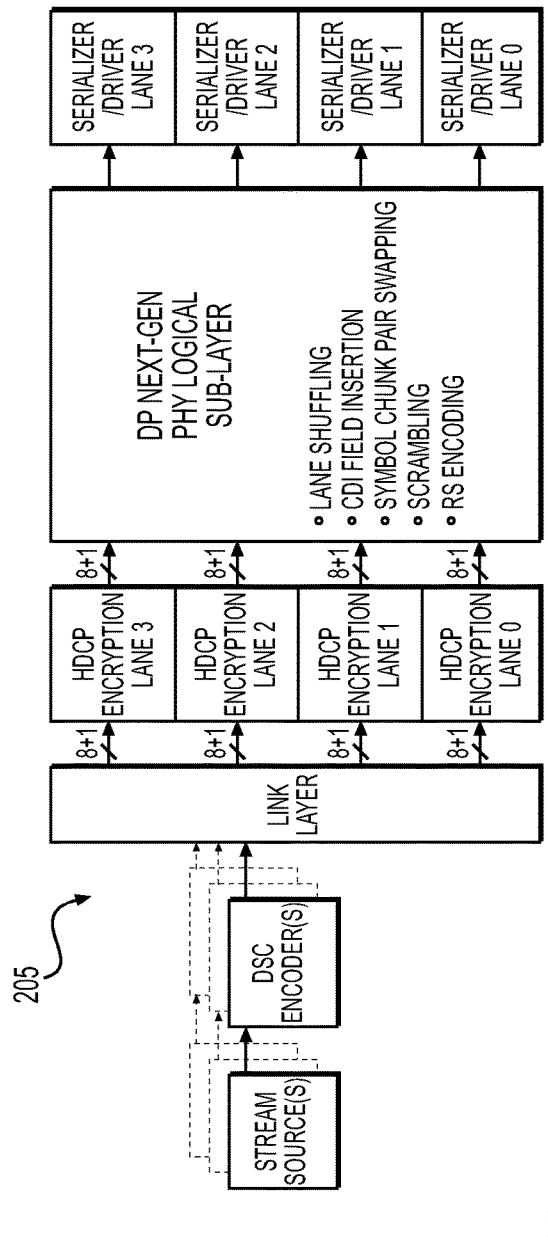
FIG. 2B illustrates logical block diagram of a DP Source Device using enhanced channel coding efficiency according to an embodiment.
Figure 2C:
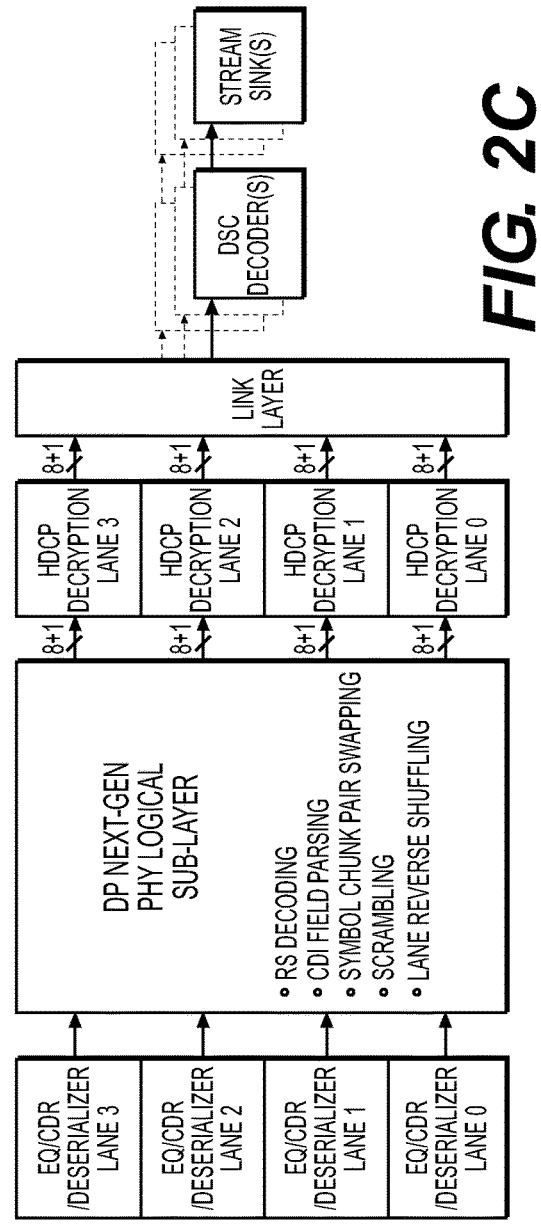
FIG. 2C illustrates logical block diagram of a DP Sink Device using enhanced channel coding efficiency according to an embodiment.

A logical block diagram is shown in FIGS. 2A, 2B and 2C. FIG. 2A that illustrates, according to some embodiments, an end-to-end system 200 that includes a DP Source Device (including a DP Transmitter) 205 (also shown in FIG. 2B) and DP Sink Device (including a DP Receiver) 210 (also shown in FIG. 1C). In these embodiments, one of 64 b/66 b, 128 b/130 b, or 128 b/132 b channel coding may be employed, along with a number of additional alterations to the functionality of the PHY Logical Sub-layer elements, to improve channel coding efficiency.

Figure 3:
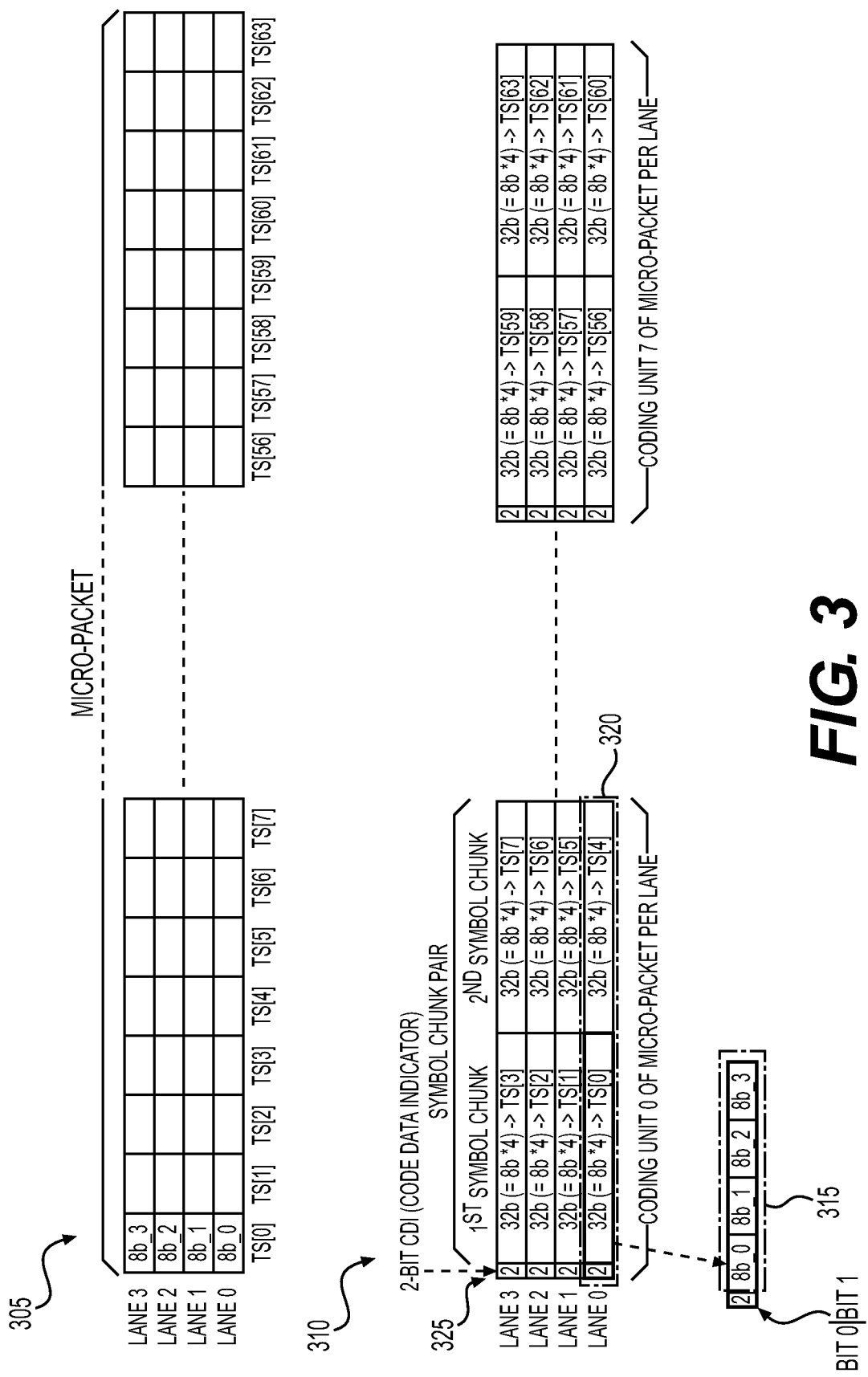
FIG. 3 illustrates lane shuffling and CDI (Code Data Indicator) field addition for enhanced channel coding efficiency according to an embodiment.

FIG. 3 illustrates aspects of a lane shuffling technique, and the use of 64 b/66 b channel coding, that may be used for DisplayPort channel coding efficiency enhancement in an embodiment. In this embodiment, instead of transmitting four DP Link Symbols (either all Data Link Symbols or all Control Link Symbols) for TS[N] (where N is an integer of 0~63 inclusive) in the same Link Symbol clock cycle, a PHY Logical Sub-layer may organize and transit four 8-bit Symbols ("Symbol Chunk") sequentially on a single lane. Referring to FIG. 3, a standard DP Micro-Packet 305 is arranged such that within each time slot (TS[0], for example) the data for a group of four 8-bit Symbols is distributed across the four lanes (Lane 0 through Lane 3). For example, for TS[0], Lane 0 contains 8-bit Symbol 8 b_0, Lane 1 contains 8-bit Symbol 8 b_1, Lane 2 contains 8-bit Symbol 8 b_2 and Lane 3 contains 8-bit Symbol 8 b_3. In an embodiment, an enhanced efficiency DP Micro-Packet 310 is arranged such that a 32-bit Symbol Chunk 315 includes the 8-bit Symbol that would otherwise be in Lane 0 as the least significant (first) 8 bits and the 8-bit Symbol that would otherwise be in Lane 3 as the most significant (last) 8 bits of the 32-bit Symbol Chunk 315. In enhanced efficiency DP Micro-Packet 310, Lane 0 may carry Symbol Chunks that include 8-bit Symbols that would otherwise (in DP1.4) be carried in TS[0], TS[4], . . . , TS[60]. Likewise, Lane 1 may carry Symbol Chunks that include 8-bit Symbols that would otherwise (in DP1.4) be carried in TS[1], TS[5], . . . , TS[61]; Lane 2 for TS[2], TS[6], . . . , TS[62]; and Lane 3 for TS[3], TS[7], . . . , TS[63].

In an embodiment, a 2-bit CDI (Code Data Indicator) field 325 precedes each group of two consecutive Symbol Chunks ("Symbol Chunk Pair") of TS[8M+X] and TS[8M+X+4] (where M is an integer 0~7 inclusive and X is a lane number, 0, 1, 2, or 3). The combination of a 2-bit CDI field 325 and two Symbol Chunks 315 make up a Coding Unit 320.

As a result, an enhanced efficiency DP Micro-Packet 310 is transported as eight Coding Units per lane over four lanes, each Coding Unit consisting of a 2-bit CDI field and a 2*32-bit Symbol Chunk Pair per lane. Over the 4-lane Main Link, the total number of bits transmitted per enhanced efficiency DP Micro-Packet 310 is 2,112 bits (8 Coding Units per lane*(2+32*2) bits per Coding Unit*4 lanes). Therefore, the channel coding efficiency is 2,048 symbol data bits/2,112 channel-coded bits, or 97.0% per enhanced efficiency DP Micro-Packet 310.

The 2-bit CDI field 325 may indicate the content type of the Symbol Chunk Pair that follows CDI field 325. In some embodiments, there may be four Symbol Chunk types—for example, Data Link Symbol Chunk, Control Link Symbol Chunk, RS Parity Symbol Chunk, and PHY Sync Symbol Chunk. RS Parity Symbol Chunk and PHY Sync Symbol Chunk may be sent on all the enabled Main Link lanes.

The CDI value may indicate the Symbol Chunk Pair content type as follows: when the CDI Bits 1:0=10, the subsequent Symbol Chunk Pair has (1) one Control Link Symbol Chunk, (2) two Control Link Symbol Chunks, or (3) a PHY Sync Symbol Chunk; when the CDI Bits 1:0=01, both Symbol Chunks of the pair are Data Link Symbol Chunks.

In some embodiments, a Symbol Chunk Pair Swapping Operation may be employed. In such embodiments, a Link Symbol Chunk for TS[8M+X] may immediately follow the CDI field except for when the CDI value is 10 and when the first Symbol Chunk (that is, Symbol Chunk for TS[8M+X]) is a Data Link Symbol Chunk and the second Symbol Chunk (that for TS[8M+X+4]) is a Control Link Symbol Chunk, in which case the DP Transmitter may transmit the TS[8M+X+4] Symbol Chunk first ("Symbol Chunk Pair swapping" operation).

The Control Link Symbol Chunk may contain the following parameters: Control Link Symbol value (4 bits), where one of eleven Control Link Symbol values in SST mode or one of nine Control Link Symbol Sequence values in MST mode; Type of the subsequent Symbol Chunk (2 bits to indicate Control Link Symbol Chunk, Data Link Symbol Chunk, or RS Parity Symbol Chunk—valid only for a Control Link Symbol Chunk that is transmitted immediately after a CDI field); Symbol Chunk Pair swapping indication (1 bit—this parameter, valid only for a Control Link Symbol Chunk that is transmitted immediately after a CDI field, indicates that the two Symbol Chunks within the Symbol Chunk Pair shall be swapped by a DP Receiver before lane reverse shuffling).

In some embodiments, the DP Transmitter performs scrambling using a Linear-Feedback Shift Register (LFSR) with the polynomial formula in equation (1) and the hexadecimal seed values below.

$$G(X)=X^{23}+X^{21}+X^{16}+X^8+X^5+X^2+X^0 \qquad (1)$$

Seed values:
1DBFBCh for Lane 0
1DBFBDh for Lane 1
1DBFBEh for Lane 2
1DBFBFh for Lane 3

In some embodiments, the DP Transmitter may apply the following rule: the 2-bit CDI field bypasses the scrambler and does not advance the scrambling LFSR.

In some embodiments, the PHY Sync Symbol Chunk may also bypass and initialize the scrambler LFSR in the most significant (last) 8-bit symbol of the PHY Sync Symbol Chunk.

Each 8-bit symbol of the Control Link Symbol Chunk and the RS Parity Symbol Chunk may advance the scrambling LFSR, but bypass the scrambler XOR block.

Each 8-bit symbol of the Data Link Symbol may advance the scrambling LFSR and may be XOR'ed with the least significant 8 bits of the LFSR value.

In some embodiments, the following Serial Bit Transmission Order may be used: for the 2-bit CDI Field, bit 0 may be transmitted first, followed by bit 1; for each 32-bit Symbol Chunk, bit 0 of the least significant 8-bit symbol may be transmitted first and bit 7 of the most significant 8-bit symbol may be transmitted last. In some embodiments, the maximum run length of the channel coding efficiency may be 68 serial bits since every CDI field has a bit transition.

Figure 4:
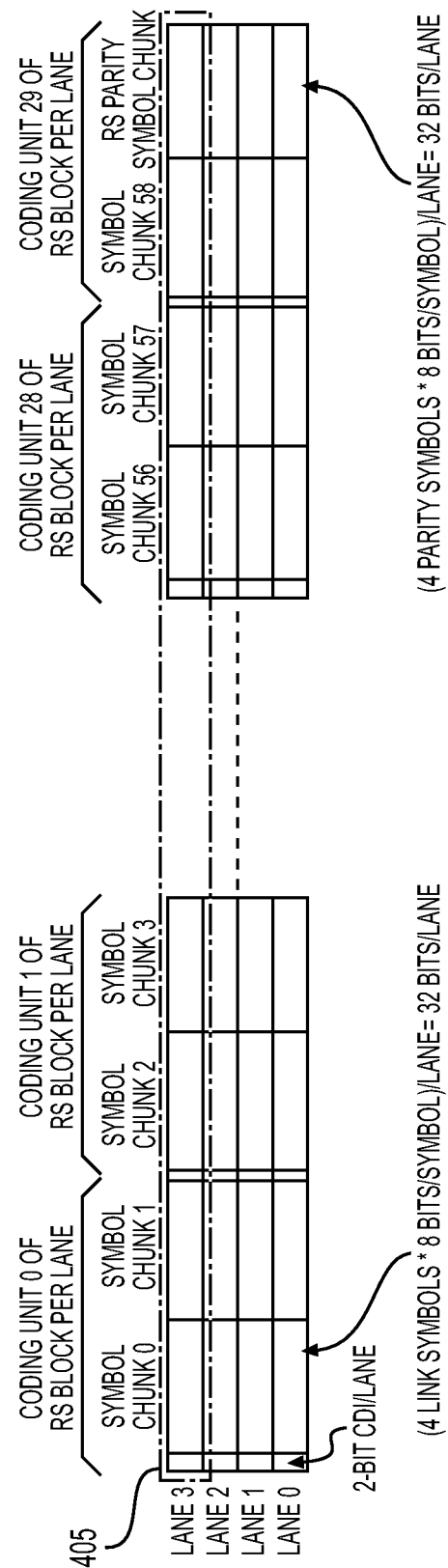
FIG. 4 illustrates RS FEC (Reed Solomon Forward Error Correction) Block mapping according to an embodiment.

FIG. 4 illustrates an exemplary RS(248, 244) block mapping of a DisplayPort channel coding efficiency enhancement method, according to some embodiments of the present disclosure. In these embodiments, RS symbol size is 8 bits per symbol, the RS data block size is 1952 bits/lane (244*8) and the RS parity block size is 32 bits/lane ([248-244] *8).

Referring to FIG. 4, a RS data block 405 consists of 59 Symbol Chunks of 32 bits each (Symbol Chunks 0 through 58) and 30 CDI fields of 2 bits each (totaling 1948 bits) plus four zero-padded bits. The zero-padded 4 bits may not be transmitted.

The first 8 bits consisting of 2 bits of CDI value plus Bits 5:0 of the least significant 8-bit symbol data of Symbol Chunk 0 are the RS Data Symbol 0. Bits 7:4 of the most significant 8 bits of Symbol Chunk 58 are Bits 3:0 of the RS Data Symbol 243 while Bits 7:4 of the RS Data Symbol 243 are zero-padded (and not transmitted).

As for the RS parity block, the least significant 8 bits of the RS Parity Symbol Chunk are the RS Parity Symbol 0 and the most significant 8 bits are the RS Parity Symbol 3.

In some embodiments, the DP Transmitter may perform 2-way interleaving between Lane 0 and Lane 1 (or Lane 2 and Lane 3) for improved error immunity.

Since the number of Coding Units per Micro-Packet is eight over the 4-lane Main Link, while the RS Block has 30 Coding Units, the location of RS Parity Symbol Chunk relative to the first Coding Unit of a Micro-Packet varies from one RS block to the next.

Figure 5:
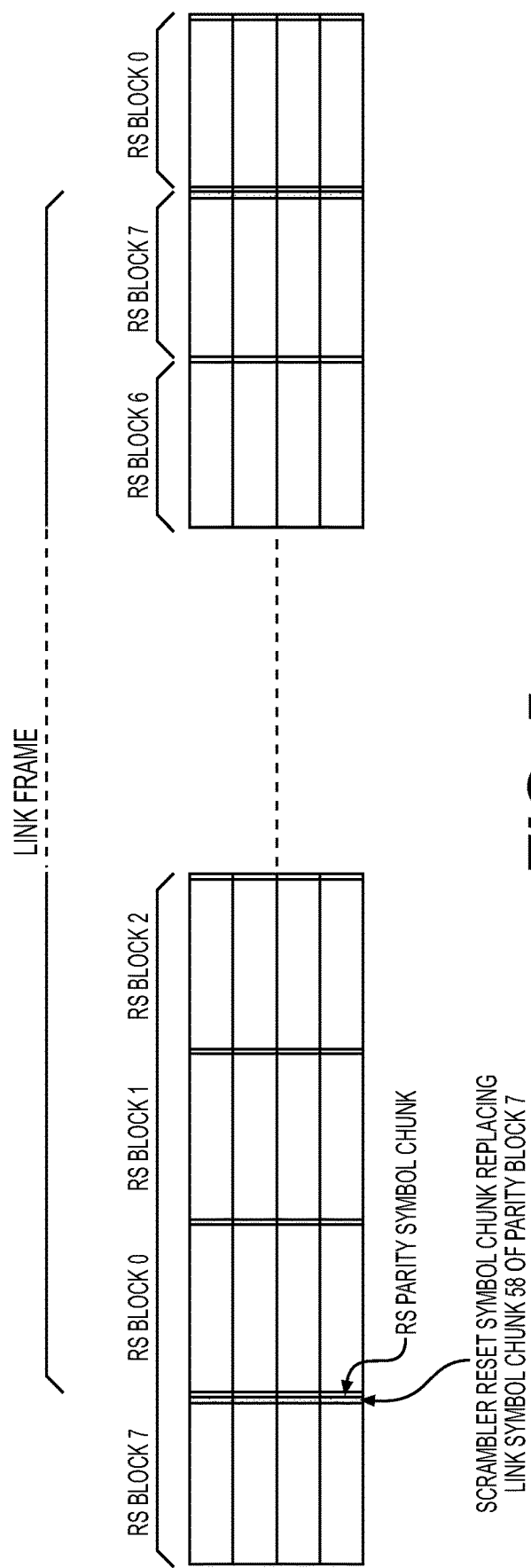
FIG. 5 illustrates Link Frame mapping according to an embodiment.

FIG. 5 illustrates the Link Frame mapping for a channel coding efficiency enhancement method, according to some embodiments. Eight RS blocks constitute a Link Frame. In some embodiments, the DP Transmitter may transmit a PHY Sync Symbol Chunk replacing either Data or Control Link Symbol Chunk 58 of RS Block 7.

The total number of bits transmitted per Link Frame, in embodiments employing 64 b/66 b channel coding, is: 30*(2+32+32)bits/RS block*8 RS blocks=15,840 bits. The number of Link Symbol Chunk data bits transmitted per Link Frame is: (59 Symbol Chunks*32 bits per Symbol Chunk) per RS block*8 RS blocks−32 bits per PHY Sync Symbol Chunk=15,072 bits. Therefore, the overall efficiency is 15,072 bits/15,840 bits, or 95.2%.

Figure 6A:
FIG. 6A illustrates mapping over 4-lane Main Link configuration according to an embodiment.
Figure 6B:
FIG. 6B illustrates mapping over 2-lane Main Link configuration according to an embodiment.
Figure 6C:
FIG. 6C illustrates mapping over 1-lane Main Link configuration according to an embodiment.

The Micro-Packet mapping to four, two or one Main Link lanes, for some embodiments, is shown FIGS. 6A, 6B, and 6C. The total number of Coding Units per Micro-Packet (across all lanes used) is 32, irrespective of the lane count. Therefore, the number of Coding Units per lane doubles as the lane count is reduced by half. For example, in FIG. 6A, where four lanes are used, the number of Coding Units per lane is eight, while in FIG. 6B, where two lanes are used, the number of Coding Units per lane is 16, and in FIG. 6C, where one lane is used, the number of Coding Units per lane is 32.

An RS Parity Symbol Chunk insertion interval is every 30 Coding Units per lane and PHY Sync Symbol Chunk interval every eight RS Blocks per lane, irrespective of the lane count.

Figure 7:
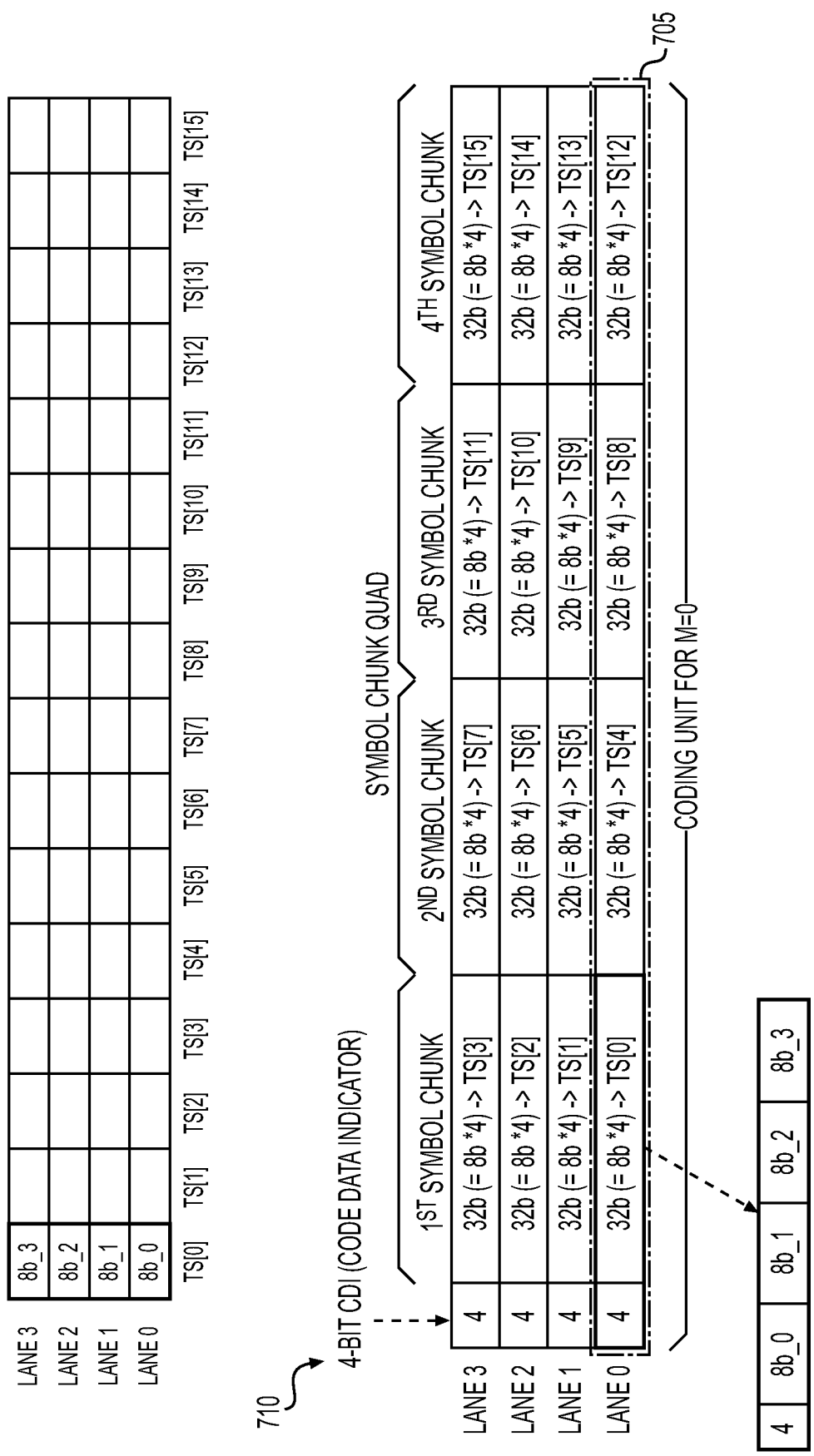
FIG. 7 illustrates Lane shuffling and CDI (Code Data Indicator) field addition for enhanced channel coding efficiency according to another embodiment.

FIG. 7 illustrates aspects of another embodiment of a DisplayPort channel coding efficiency enhancement. Such an embodiment may use a so-called 128 b/132 b channel coding. The 128 b/132 b channel coding unit mapping is performed according to the following conditions. In this embodiment, Symbol Chunks (each having four 8-bit Symbols) are collected into groups of four consecutive Symbol Chunks, referred to as a Symbol Chunk Quad 705.

In an embodiment, a 4-bit CDI (Code Data Indicator) field 710 precedes each Symbol Chunk Quad TS[16M+X], TS[16M+X+4], TS[16M+X+8], and TS[16M+X+12] (where M is an integer 0~3 inclusive and X is a lane number, 0, 1, 2, or 3). As shown in FIG. 7, the 4-bit CDI field 710 of Coding Unit for M=0 on Lane 0 precedes the Symbol Chunk for TS[0], TS[4], TS[8] and TS[12].

The CDI value may indicate, for some embodiments, the Symbol Chunk Quad content type as follows: when the CDI Bits=1100, the subsequent Symbol Chunk Quad may contain Control Link Symbol Chunk(s) or PHY Sync Symbol Chunk(s); when the CDI Bits=0011, the subsequent Symbol Chunk Quad may contain four Data Link Symbol Chunks.

In some embodiments, the Bits 3:0 of each Control Link Symbol Field may be defined as follows: Bit 0=1st Symbol Chunk Type, Bit 1=2nd Symbol Chunk Type, Bit 2=3rd Symbol Chunk Type, Bit 3=4th Symbol Chunk Type, where the bit values is 1 for a Control Link Symbol Chunk or PHY Sync Symbol Chunk and is 0 for a Data Link Symbol Chunk.

In some embodiments, the DP Transmitter may set a Symbol Chunk Type Vector field bit to indicate Symbol Chunk swapping. In such embodiments, when the first Symbol Chunk is a Data Link Symbol Chunk, it may be swapped with the closet Control Link Symbol Chunk within the Symbol Chunk Quad.

In some embodiments, a PHY Sync Symbol may indicate the Symbol Chunk Types of the 3rd and 4th Symbol Chunks of a Symbol Chunk Quad. For example, when the PHY Sync Symbol is 33*h*, then both the 3rd and 4th Symbol Chunks are Control Link Symbol Chunks; when the PHY Sync Symbol is AAh then the 3rd Symbol Chunk is a Data Link Symbol Chunk and the 4th Symbol Chunk is a Control Link Symbol Chunk; when the PHY Sync Symbol is BBh then the 3rd Symbol Chunk is a Control Link Symbol Chunk and the 4th Symbol Chunk is a Data Link Symbol Chunk, and when the PHY Sync Symbol is CCh then both the 3rd and 4th Symbol Chunks are Data Symbol Chunks.

In the foregoing embodiments using the 128 b/132 b channel coding, the same LFSR (both polynomial—equation 1—and the seed values provided) and rules may be used as disclosed above with reference to disclosed embodiments that use the 64 b/66 b channel coding.

In the foregoing embodiments using the 128 b/132 b channel coding, the same RS FEC using RS(248, 244) may be used as disclosed above with reference to disclosed embodiments that use the 64 b/66 b channel coding. In such embodiments, the RS data block may consist of 59 Symbol Chunks plus fifteen 4-bit CDI fields. The RS parity block may consist of four 8-bit parity symbols contained in RS Parity Symbol Chunk.

In some embodiments, a Link Frame may be marked by a PHY Sync Symbol Chunk inserted immediately after a CDI field with a fixed interval of 8 RS blocks. A PHY Sync Symbol Chunk, when inserted, may always be followed by a RS Parity Symbol Chunk.

The 128 b/132 b channel coding of the foregoing embodiments increases the channel coding efficiency from 78.1% of DP1.4 standard to 95.2% including RS FEC overhead.

Figure 8:
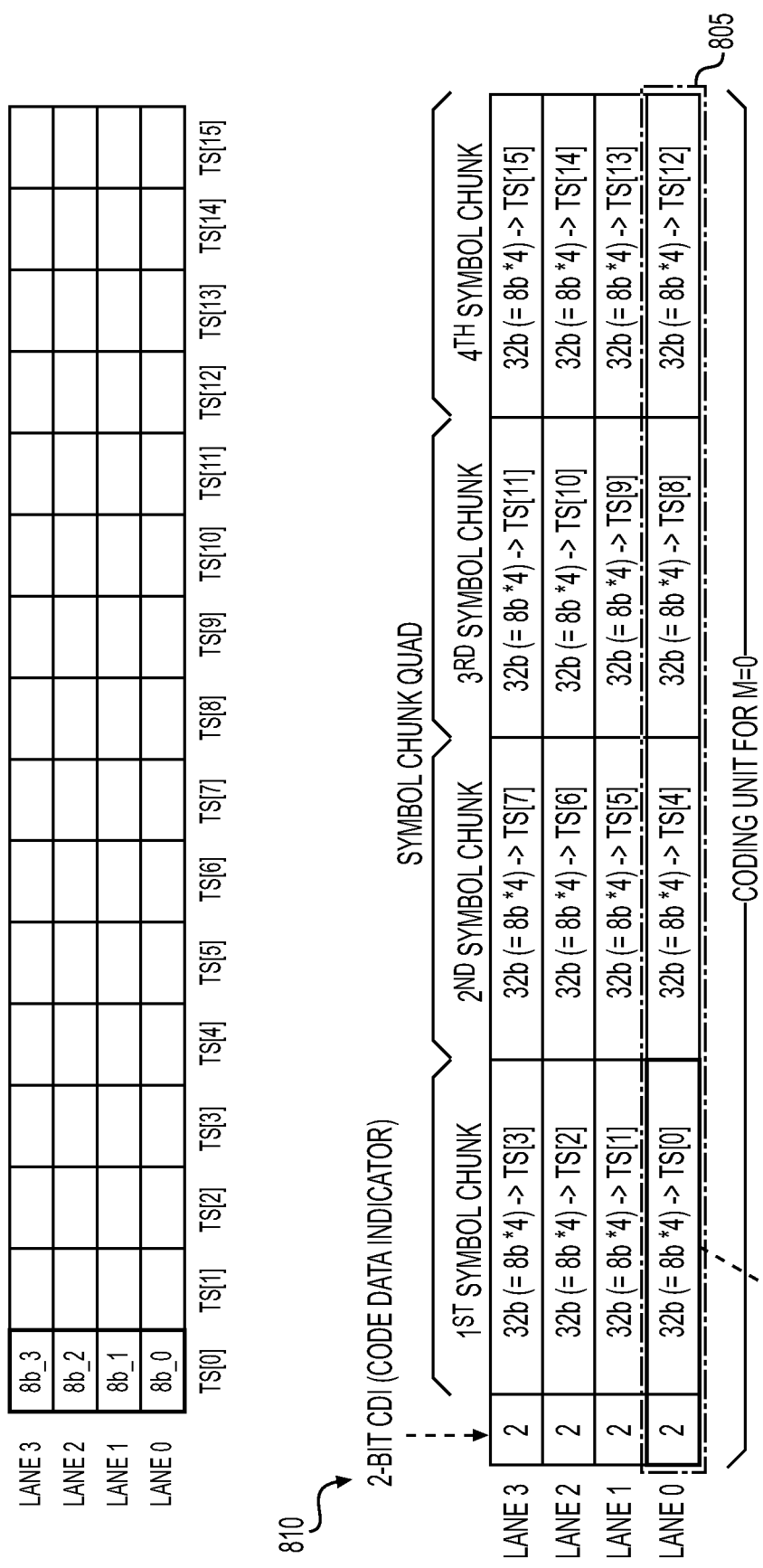
FIG. 8 illustrates Lane shuffling and CDI (Code Data Indicator) field addition for enhanced channel coding efficiency according to yet another embodiment.

FIG. 8 illustrates aspects of yet another embodiment of a DisplayPort channel coding efficiency enhancement. Such an embodiment may use a so-called 128 b/130 b channel coding. In this embodiment, similar to embodiments using the 128 b/132 b channel coding disclosed above, Symbol Chunks (each having four 8-bit Symbols) are collected into groups of four consecutive Symbol Chunks, again referred to as a Symbol Chunk Quad 805.

In an embodiment, a 2-bit CDI field 810 precedes a Symbol Chunk Quad. The CDI value indicates the Symbol Chunk Quad types.

The CDI value may indicate, for some embodiments, the Symbol Chunk Quad types as follows: when the CDI Bits=10, the subsequent Symbol Chunk Quad may contain Control Link Symbol Chunk(s) or a PHY Sync Symbol Chunk; when the CDI Bits=01, the subsequent Symbol Chunk Quad may contain four Data Link Symbol Chunks.

In embodiments based on 128 b/130 b channel coding, the Control Link Symbol Fields may be the same as in the embodiments based on 128 b/132 b channel coding disclosed above.

In embodiments based on 128 b/130 b channel coding, the PHY Sync Symbol Chunk may be the same as in the embodiments based on 128 b/132 b channel coding disclosed above.

In embodiments using the 128 b/130 b channel coding, the same LFSR (both polynomial—equation 1—and the seed values provided) and rules may be used as disclosed above with reference to disclosed embodiments that use the 64 b/66 b channel coding.

In embodiments using the 128 b/130 b channel coding, the RS FEC using RS(244, 240) may be used with the same polynomials as disclosed above with reference to disclosed embodiments that use the 64 b/66 b channel coding. In such embodiments, the RS data block may consist of 59 Symbol Chunks plus fifteen 2-bit CDI fields. The RS parity block may consist of four 8-bit parity symbols contained in RS Parity Symbol Chunk.

In some embodiments, a Link Frame may be marked by a PHY Sync Symbol Chunk inserted immediately after a CDI field with a fixed interval of 8 RS blocks. A PHY Sync Symbol Chunk, when inserted, may always be followed by a RS Parity Symbol Chunk.

The 128 b/130 b channel coding of these embodiments increases the channel coding efficiency from 78.1% of DP1.4 standard to 96.8% including RS FEC overhead.

The present invention has been described in connection with the above description, it is not intended to limit the scope of the invention to the particular form set forth, but on the contrary, it is intended to cover such alternatives, modifications, and equivalents as may be included within the spirit and scope of the inventions as defined by the appended claims.

Obviously, numerous modifications and variations of the present invention are possible in light of the above teachings. It is therefore to be understood that within the scope of the appended claims, the invention may be practiced otherwise than as specifically described herein.

The invention claimed is:

1. A method comprising:
    transmitting a plurality of coding units for each micro-packet in each of one or more lanes of a DisplayPort Main Link from a DisplayPort transmitter, wherein each of the coding units comprises:
    a group of m symbol chunks, each symbol chunk including four 8-bit symbols, wherein m is 2 or 4, and wherein all of the symbol chunks in the group have one of a plurality of content types; and
    an n-bit code data indicator, wherein n is 2 or 4, wherein the n-bit code data indicator indicates the one of the plurality of content types.

2. The method of claim 1, wherein the content types comprise:
    a data link symbol, or one or more of a control link symbol, a Reed Solomon (RS) parity symbol, or a PHY sync symbol.

3. The method of claim 1, further comprising:
    transmitting eight coding units per lane in each of four lanes of the DisplayPort Main Link for each micro-packet.

4. The method of claim 1, further comprising:
    transmitting 16 coding units per lane in each of two lanes of the DisplayPort Main Link for each micro-packet.

5. The method of claim 1, further comprising:
    transmitting 32 coding units per lane in a single lane of the DisplayPort Main Link for each micro-packet.

6. A method comprising:
    receiving a plurality of coding units for each micro-packet in each of one or more lanes of a DisplayPort Main Link from a DisplayPort transmitter, wherein each of the coding units comprises:
    a group of m symbol chunks, each symbol chunk including four 8-bit symbols, wherein m is 2 or 4, and wherein all of the symbol chunks in the group have one of a plurality of content types; and
    an n-bit code data indicator, wherein n is 2 or 4, wherein the n-bit code data indicator indicates the one of the plurality of content types.

7. The method of claim 6, wherein the content types comprise:
    a data link symbol, or one or more of a control link symbol, a Reed Solomon (RS) parity symbol, or a PHY sync symbol.

8. The method of claim 6, further comprising:
    receiving eight coding units per lane in each of four lanes of the DisplayPort Main Link for each micro-packet.

9. The method of claim 6, further comprising:
receiving 16 coding units per lane in each of two lanes of the DisplayPort Main Link for each micro-packet.

10. The method according to claim 6, further comprising:
receiving 32 coding units per lane in a single lane of the DisplayPort Main Link for each micro-packet.

11. A transmission device for a DisplayPort interface comprising:
one or more lane serializer-drivers; and
a PHY logical sub-layer configured to arrange and transmit data to the one or more lane serializer-drivers, wherein the data comprises a plurality of coding units for each micro-packet directed to each of the one or more lane serializer-drivers, and wherein each of the coding units comprises:
a group of m symbol chunks, each symbol chunk including four 8-bit symbols, wherein m is 2 or 4, and wherein all of the symbol chunks in the group have one of a plurality of content types; and
an n-bit code data indicator, wherein n is 2 or 4, wherein the n-bit code data indicator indicates the one of the plurality of content types.

12. The transmission device of claim 11, wherein the content types comprise:
a data link symbol, or one or more of a control link symbol, a Reed Solomon (RS) parity symbol, or a PHY sync symbol.

13. The transmission device of claim 11, wherein eight coding units per lane are transmitted for each micro-packet in each of four lanes of the DisplayPort Main Link.

14. The transmission device of claim 11, wherein 16 coding units per lane are transmitted for each micro-packet in each of two lanes of the DisplayPort Main Link.

15. The transmission device of claim 11, wherein 32 coding units per lane are transmitted for each micro-packet in a single lane of the DisplayPort Main Link.

16. The transmission device of claim 11, further comprising:
one or more High-bandwidth Digital Content Protection (HDCP) encryption circuits communicatively coupled to the PHY logical sub-layer element for encrypting data.

17. The transmission device of claim 11, wherein the PHY logical sub-layer is further configured to perform Reed Solomon (RS) Forward Error Correction on the data.

18. A reception device for a DisplayPort interface comprising:
a receiver configured to receive a plurality of coding units for each micro-packet in each of one or more lanes of a DisplayPort Main Link from a DisplayPort transmitter, wherein each of the coding units comprises:
a group of m symbol chunks, each symbol chunk including four 8-bit symbols, wherein m is 2 or 4, and wherein all of the symbol chunks in the group have one of a plurality of content types; and
an n-bit code data indicator, wherein n is 2 or 4, wherein the n-bit code data indicator indicates the one of the plurality of content types.

19. The reception device of claim 18, wherein the content types comprise:
a data link symbol, or one or more of a control link symbol, a Reed Solomon (RS) parity symbol, or a PHY sync symbol.

20. The reception device of claim 18, wherein eight coding units per lane are received for each micro-packet in each of four lanes of the DisplayPort Main Link.

21. The reception device of claim 18, wherein 16 coding units per lane are received for each micro-packet in each of two lanes of the DisplayPort Main Link.

22. The reception device of claim 18, wherein 32 coding units per lane are received for each micro-packet in a single lane of the DisplayPort Main Link.

* * * * *

UNITED STATES PATENT AND TRADEMARK OFFICE
CERTIFICATE OF CORRECTION

PATENT NO. : 10,942,886 B2
APPLICATION NO. : 16/808283
DATED : March 9, 2021
INVENTOR(S) : Kobayashi et al.

It is certified that error appears in the above-identified patent and that said Letters Patent is hereby corrected as shown below:

On the Title Page

Item (72) Inventors:
Alan Kobayashi, Los Altos, CA (US); Sujan Valiyaka Thomas, Pleasanton, CA (US); Ramakrishna Chilukuri, San Jose, CA (US); Rahul Kumar Agarwal, Saratoga, CA (US); Iyothsna Nagaraja, San Jose, CA (US)

Should be corrected to read:
Alan Kobayashi, Los Altos, CA (US); Sujan Valiyaka Thomas, Pleasanton, CA (US); Ramakrishna Chilukuri, San Jose, CA (US); Rahul Kumar Agarwal, Saratoga, CA (US); Jyothsna Nagaraja, San Jose, CA (US)

Signed and Sealed this
Fourth Day of June, 2024

Katherine Kelly Vidal
*Director of the United States Patent and Trademark Office*